US011557713B2

(12) United States Patent
Shibata et al.

(10) Patent No.: US 11,557,713 B2
(45) Date of Patent: Jan. 17, 2023

(54) LAMINATED SUBSTRATE HAVING PIEZOELECTRIC FILM, ELEMENT HAVING PIEZOELECTRIC FILM AND METHOD FOR MANUFACTURING THIS LAMINATED SUBSTRATE

(71) Applicant: SUMITOMO CHEMICAL COMPANY, LIMITED, Tokyo (JP)

(72) Inventors: Kenji Shibata, Hitachi (JP); Kazutoshi Watanabe, Hitachi (JP); Fumimasa Horikiri, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 453 days.

(21) Appl. No.: 16/628,524

(22) PCT Filed: Jun. 22, 2018

(86) PCT No.: PCT/JP2018/023864
§ 371 (c)(1),
(2) Date: Jan. 3, 2020

(87) PCT Pub. No.: WO2019/012960
PCT Pub. Date: Jan. 17, 2019

(65) Prior Publication Data

US 2020/0161533 A1 May 21, 2020

(30) Foreign Application Priority Data

Jul. 12, 2017 (JP) ............................ JP2017-136447

(51) Int. Cl.
*H01L 41/187* (2006.01)
*H01L 41/08* (2006.01)
*H01L 41/27* (2013.01)

(52) U.S. Cl.
CPC ...... *H01L 41/1873* (2013.01); *H01L 41/0805* (2013.01); *H01L 41/27* (2013.01)

(58) Field of Classification Search
None
See application file for complete search history.

(56) References Cited

U.S. PATENT DOCUMENTS

2004/0237882 A1* 12/2004 Higuchi ............. H03H 9/02574 117/95
2007/0024162 A1* 2/2007 Shibata ............... H01L 41/0805 310/358

(Continued)

FOREIGN PATENT DOCUMENTS

JP 2004-282232 A 10/2004
JP 2005-057707 A 3/2005

(Continued)

OTHER PUBLICATIONS

Partial Supplementary European Search Report dated Dec. 21, 2020 for corresponding European Patent Application No. 18832152.5.

(Continued)

*Primary Examiner* — Scott B Geyer
(74) *Attorney, Agent, or Firm* — Foley & Lardner LLP

(57) ABSTRACT

There is provided a laminated substrate having a piezoelectric film, including: a substrate; and a piezoelectric film provided on the substrate interposing a base film, wherein the piezoelectric film has an alkali niobium oxide based perovskite structure represented by a composition formula of $(K_{1-x}Na_x)NbO_3$ $(0<x<1)$ and preferentially oriented in (001) plane direction, and a sound speed of the piezoelectric film is 5100 m/s or more.

3 Claims, 3 Drawing Sheets

10

4 3 7 6 1b 1 1a

(56) References Cited

U.S. PATENT DOCUMENTS

2007/0126313 A1 6/2007 Ueno et al.
2007/0271750 A1* 11/2007 Hamada .............. C23C 18/1279 438/678
2009/0236944 A1 9/2009 Shibata et al.
2010/0038993 A1* 2/2010 Umeda .............. H03H 9/02574 310/313 B
2011/0121690 A1* 5/2011 Shibata ............... H01L 41/0805 310/311
2013/0106242 A1 5/2013 Shibata et al.
2016/0372654 A1* 12/2016 Ikeuchi ................. H01L 41/187
2018/0114896 A1 4/2018 Horikiri et al.
2018/0301618 A1 10/2018 Shibata et al.

FOREIGN PATENT DOCUMENTS

JP 2007-184513 A 7/2007
JP 2008-159807 A 7/2008
JP 2010-016018 A 1/2010
JP 2013237607 A * 11/2013 ............. B32B 18/00
JP 2017-076730 A 4/2017
WO WO-2011121863 A1 * 10/2011 ........... C23C 14/088
WO WO-2016/152419 A1 9/2016

OTHER PUBLICATIONS

International Searching Authority, “International Search Report,” issued in connection with International Patent Application No. PCT/JP2018/023864, dated Aug. 21, 2018.
International Searching Authority, “Written Opinion,” issued in connection with International Patent Application No. PCT/JP2018/023864, dated Aug. 21, 2018.
Extended European Search Report dated May 3, 2021 for corresponding European Patent Application No. 18832152.5.
International Preliminary Report on Patentability dated Jan. 14, 2020 for corresponding Application No. PCT/JP2018/023864.

* cited by examiner

LAMINATED SUBSTRATE HAVING PIEZOELECTRIC FILM, ELEMENT HAVING PIEZOELECTRIC FILM AND METHOD FOR MANUFACTURING THIS LAMINATED SUBSTRATE

CROSS-REFERENCE TO RELATED APPLICATIONS

The present application claims priority under 37 U.S.C. § 371 to International Patent Application No. PCT/JP2018/023864, filed Jun. 22, 2018, which claims priority to and the benefit of Japanese Patent Application No. 2017-136447, filed on Jul. 12, 2017. The contents of these applications are hereby incorporated by reference in their entireties.

TECHNICAL FIELD

The present disclosure relates to a laminated substrate having a piezoelectric film, an element having a piezoelectric film, and a method for manufacturing this laminated substrate.

DESCRIPTION OF RELATED ART

A piezoelectric material is utilized widely for a functional electronic component such as a filter device. For example, potassium sodium niobate (KNN) is used as the piezoelectric material (see patent documents 1 and 2, for example). Recently, it is strongly required to provide the piezoelectric material suitable for application to the filter device of a high frequency band.

PRIOR ART DOCUMENT

Patent Document

Patent document 1: Japanese Patent Laid Open Publication No. 2007-184513

Patent document 2: Japanese Patent Laid Open Publication No. 2008-159807

SUMMARY

Problem to be Solved by Disclosure

An object of the present disclosure is to provide a piezoelectric film suitable for application to a filter device of a high frequency band, and a related technique thereof.

Means for Solving the Problem

According to an aspect of the present disclosure, there is provided a laminated substrate having a piezoelectric film and a related technique thereof, including:

a substrate; and a piezoelectric film provided on the substrate interposing a base film, wherein the piezoelectric film has an alkali niobium oxide based perovskite structure represented by a composition formula of $(K_{1-x}Na_x)NbO_3$ $(0<x<1)$ and preferentially oriented in (001) plane direction, and a sound speed of the piezoelectric film is 5100 m/s or more.

Advantage of the Disclosure

According to the present disclosure, there is provided a piezoelectric film suitable for application to a filter device of a high frequency band, and a related technique thereof.

DETAILED DESCRIPTION OF THE DISCLOSURE

An Embodiment of the Present Disclosure

An embodiment of the present disclosure will be described hereafter, with reference to drawings.

(1) A Constitution of a Laminated Substrate

Figure 1:
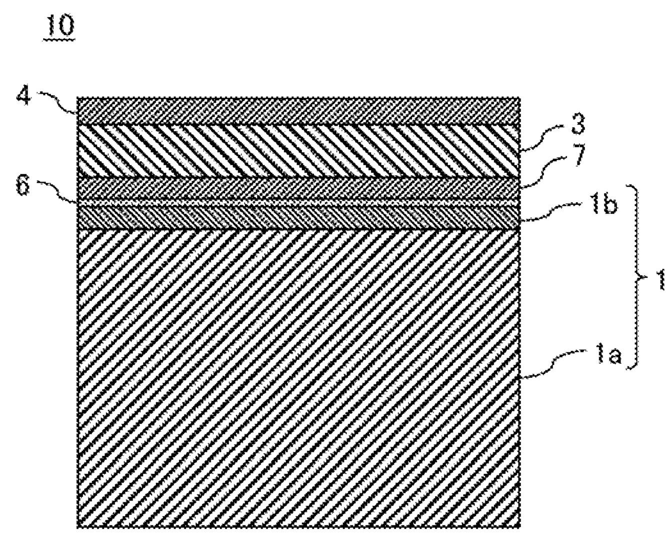
FIG. 1 is a view showing an example of a cross-sectional structure of a laminated substrate according to an embodiment of the present disclosure.

As shown in FIG. 1, a laminated substrate 10 according to the present embodiment is constituted as a laminate including a substrate 1, a base film 7 provided on the substrate 1, a piezoelectric film (piezoelectric thin film) 3 provided on the base film 7, and a top electrode film 4 provided on the piezoelectric film 3.

Figure 2:
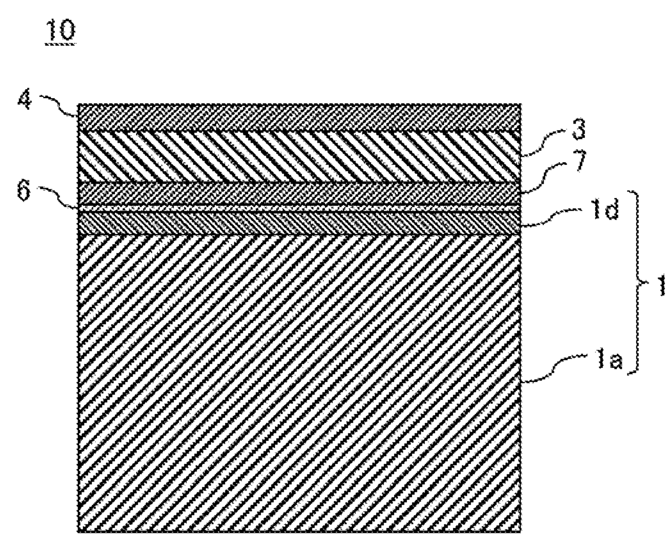
FIG. 2 is a view showing a modified example of the cross-sectional structure of the laminated substrate according to an embodiment of the present disclosure.

As the substrate 1, a single-crystal silicon (Si) substrate 1*a* on which a surface oxide film ($SiO_2$-film) 1*b* such as a thermal oxide film or a CVD (Chemical Vapor Deposition) oxide film is provided (formed), namely, a Si-substrate having the surface oxide film, can be used preferably. Further, as shown in FIG. 2, a Si-substrate 1*a* having an insulating film 1*d* provided on its surface may also be used as the substrate 1, the insulating film 1*d* containing an insulating material other than $SiO_2$. Further, a Si-substrate 1*a* in which Si-(100) plane or Si-(111) plane, etc., is exposed on a surface thereof, namely, a Si-substrate not having the surface oxide film 1*b* or the insulating film 1*d* may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate containing a metal material such as stainless steel may also be used as the substrate 1. The single-crystal Si-substrate 1*a* has a thickness of 300 to 1000 μm for example, and the surface oxide film 1*b* has a thickness of 5 to 3000 nm for example.

The base film 7 can be formed (provided, deposited) using platinum (Pt) for example. The base film 7 is a single-crystal film or a poly-crystal film (they are also referred to as Pt-film hereafter). Preferably, crystals constituting the Pt-film are preferentially oriented in (111) plane direction with respect to a surface of the substrate 1. Namely, it is preferable that a surface of the Pt-film (a surface which is a base of the piezoelectric film 3) is mainly constituted of Pt-(111) plane. The Pt-film can be formed using a method such as a sputtering method, or an evaporation method. In addition to Pt, the base film 7 may also be formed using various metals such as gold (Au), ruthenium (Ru), or iridium (Ir), an alloy mainly composed of the above various metals, or a metallic oxide such as strontium ruthenate ($SrRuO_3$) or lanthanum nickel oxide ($LaNiO_3$), etc. An adhesion layer 6 mainly composed of titanium (Ti), tantalum (Ta), titanium oxide ($TiO_2$), or nickel (Ni), etc., for example is formed between the substrate 1 and the base film 7 in order to enhance an adhesion between them. The adhesion layer 6 can be formed using a method such as a sputtering method, or an evaporation method. The base film 7 has a thickness of 100 to 400 nm for example, and the adhesion layer 6 has a thickness of 1 to 200 nm for example.

The piezoelectric film 3 can be formed (provided, deposited) using alkali niobium oxide which contains for example, potassium (K), sodium (Na), and niobium (Nb), and which is represented by a composition formula of $(K_{1-x}Na_x)NbO_3$. Namely, the piezoelectric film 3 can be formed using potassium sodium niobate (KNN). A coefficient x [=Na/(K+Na)] in the above composition formula is a value in a range of $0<x<1$, preferably $0.4\leq x\leq 0.7$. The piezoelectric film 3 is a poly-crystal film of KNN (also referred to as KNN-film 3 hereafter). A crystal structure of KNN is a perovskite structure.

Preferably, crystals constituting the KNN-film 3 are preferentially oriented in (001) plane direction with respect to the surface of the substrate 1. Namely, it is preferable that a surface of the KNN-film 3 (a surface which is a base of the top electrode film 4) is mainly constituted of KNN-(001) plane. By forming the KNN-film 3 directly on the Pt-film (base film 7) preferentially oriented in (111) plane direction with respect to the surface of the substrate 1, crystals constituting the KNN-film 3 can be easily preferentially oriented in (001) plane direction with respect to the surface of the substrate 1. For example, 85% or more of crystals of a crystal group constituting the KNN-film 3 can be oriented in (001) plane direction with respect to the surface of the substrate 1, and thereby a region of 85% or more of the surface of the KNN-film 3 can be KNN-(001) plane. Namely, a (001)-orientation ratio of the KNN-film 3 can be 85% or more.

The KNN-film 3 can be formed using a method such as a sputtering method, a PLD (Pulsed Laser Deposition) method, or a sol-gel method. A composition ratio of the KNN-film 3 can be adjusted by controlling a composition of a target material used during sputtering, for example. The target material can be produced by mixing and firing $K_2CO_3$-powder, $Na_2CO_3$-powder, $Nb_2O_5$-powder, etc., for example. In this case, the composition of the target material can be controlled by adjusting a mixed ratio of $K_2CO_3$-powder, $Na_2CO_3$-powder, $Nb_2O_5$-powder, etc.

In the KNN-film 3, its sound speed is 5100 m/s or more, preferably 5700 m/s or more, and more preferably 5800 m/s or more.

Figure 5:
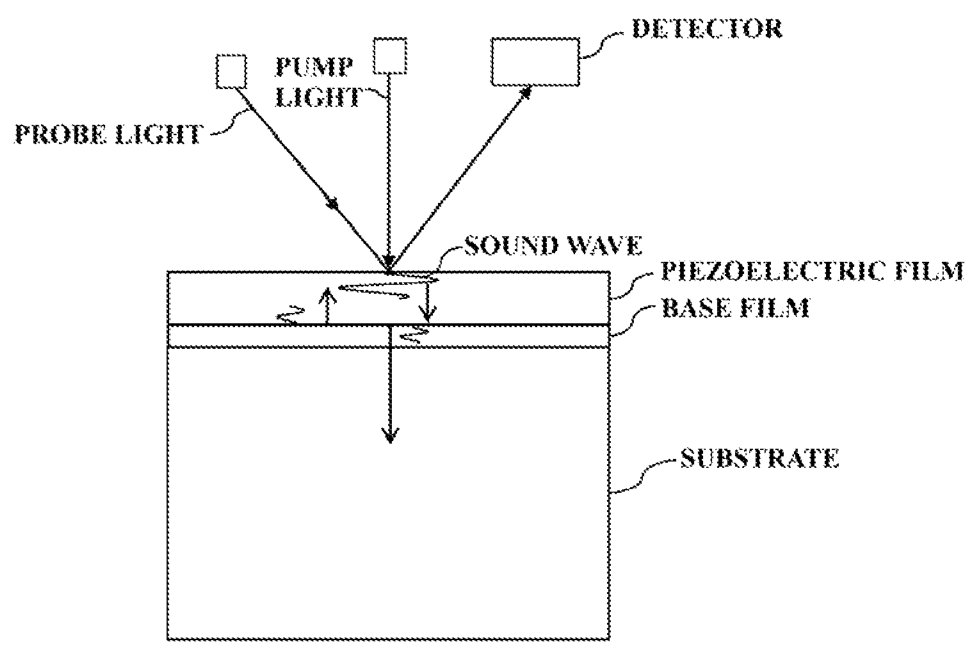
FIG. 5 is a view showing a measurement principle of a sound speed of a piezoelectric film according to an embodiment of the present disclosure.

In this specification, the sound speed is measured using Brillouin Oscillation method. FIG. 5 shows an example of a measurement principle view of the sound speed by Brillouin Oscillation method. As exemplified in FIG. 5, first, the surface of the KNN-film 3 is irradiated with a pump light and a probe light which are femtosecond laser pulsed light for example. The pump light is the light for exciting a sound wave in the KNN-film 3. Specifically, the surface of the KNN-film 3 is irradiated with the pump light vertically to the surface of the KNN-film 3, to thereby increase locally and instantaneously a temperature in the vicinity of the surface of the KNN-film 3 at an irradiation position of the pump light. The sound wave (ultrasonic pulse) is excited in the KNN-film 3, due to a thermal stress generated at the above position. This sound wave is a longitudinal wave which mainly propagates in a vertical direction to the surface of the KNN-film 3. A part of the sound wave which propagates in the KNN-film 3 toward the base film 7, is reflected at an interface between the KNN-film 3 and the base film 7, and returns to the surface (vicinity of the surface) of the KNN-film 3. As a result, the surface of the KNN-film 3 is deformed. The probe light is the light for irradiating the irradiation position of the pump light on the surface of the KNN-film 3 at a prescribed angle with respect to the surface of the KNN-film 3. A prescribed delay time may be given to the probe light. The reflected light of the probe light is continuously detected by a detector, and its reflectance is continuously measured, to thereby obtain a function of a delay time between the pump light and the probe light, and the reflectance of the probe light. When the surface of the KNN-film 3 is deformed by the reflected light of the pump light as described above, the reflectance of the reflected light of the probe light is varied, and a peak (echo) occurs. As a result, the time from the irradiation of the pump light to the occurrence of the peak, coincides with a propagation time of the sound wave which propagates in the KNN-film 3 and returns to the surface of the KNN-film 3. In this embodiment, since a thickness of the KNN-film 3 is already known, the sound speed of the KNN-film 3 can be calculated based on the time between the peaks.

The sound speed of the KNN-film 3 depends on an orientation state in (001) plane direction of the crystals constituting the KNN-film 3 (also referred to as (001)-orientation state of the KNN-film 3 hereafter). The sound speed of the KNN-film 3 increases as the number of crystals oriented in (001) plane direction in the KNN-film 3 increase, namely as the (001)-orientation ratio of the KNN-film 3 becomes higher. Further, the sound speed of the KNN-film 3 decreases as the number of the crystals oriented in (001) plane direction in the KNN-film 3 decrease, namely as the (001)-orientation ratio of the KNN-film 3 becomes lower. Hereafter, high (001)-orientation ratio of the KNN-film 3 is also called "(001)-high orientation", and low (001)-orientation ratio of the KNN-film 3 is also called "(001)-low orientation".

For example, a mixed gas ($Ar/O_2$-mixed gas) of argon (Ar) gas and oxygen (02) gas is used as an atmosphere gas during sputtering of the KNN-film 3. However, water existing in a chamber is sometimes mixed in the atmosphere gas although its content is very small. The (001)-orientation state of the KNN-film 3 greatly depends on a partial pressure of $H_2O$ contained in the atmosphere gas during sputtering. The (001)-orientation state tends to be (001)-high orientation when $H_2O$-partial pressure is low, and tends to be (001)-low orientation when $H_2O$-partial pressure is high. The (001)-orientation ratio of the KNN-film 3 can be adjusted by controlling the partial pressure of $H_2O$ containing in the $Ar/O_2$-mixed gas during sputtering. The (001)-orientation ratio of the KNN-film 3 can be 85% or more by adjusting the $H_2O$-partial pressure to 1/100 or less, preferably 1/300 or less of a pressure in a growth atmosphere, for example.

When a later-described piezoelectric film device 30 produced by processing the laminated substrate 10, functions as a filter device of a high frequency band, the sound speed of the KNN-film 3 is preferably fast. However, according to a current state of the art, the sound speed of the KNN-film 3 is 6000 m/s or less for example, due to an upper limit of the (001)-orientation ratio of the KNN-film 3, or a mixture of inevitable impurities into the KNN-film 3 during formation of the KNN-film 3, etc.

An absolute value $|d_{31}|$ of a piezoelectric constant of the KNN-film 3 is 90 pm/V or more for example ($|d_{31}| \geq 90$ pm/V), preferably 100 pm/V or more ($|d_{31}| \geq 100$ pm/V). A thickness of the KNN-film 3 is 0.5 to 5 μm or less for example.

The KNN-film 3 may contain an element such as copper (Cu), manganese (Mn), lithium (Li), Ta, antimony (Sb) other than K, Na, Nb in a range of 5 at % or less.

The top electrode film 4 can be formed (provided, deposited) using various metals such as Pt, Au, aluminum (Al), or Cu, or an alloy of these various metals, for example. The top electrode film 4 can be formed using a method such as a sputtering method, an evaporation method, a plating method, or a metal paste method. The top electrode film 4 does not greatly affect the crystal structure of the KNN-film 3 unlike the base film 7. Therefore, a material and a crystal structure of the top electrode film 4, and a method for forming the top electrode film 4 are not particularly limited. An adhesion layer mainly composed of Ti, Ta, $TiO_2$, Ni, etc., for example may be formed between the KNN-film 3 and the top electrode film 4 in order to enhance an adhesion between them. The top electrode film 4 has a thickness of 100 to 5000 nm for example, and the adhesion layer has a thickness of 1 to 200 nm in a case of forming the adhesion layer.

(2) A Constitution of a Piezoelectric Film Device

Figure 3:
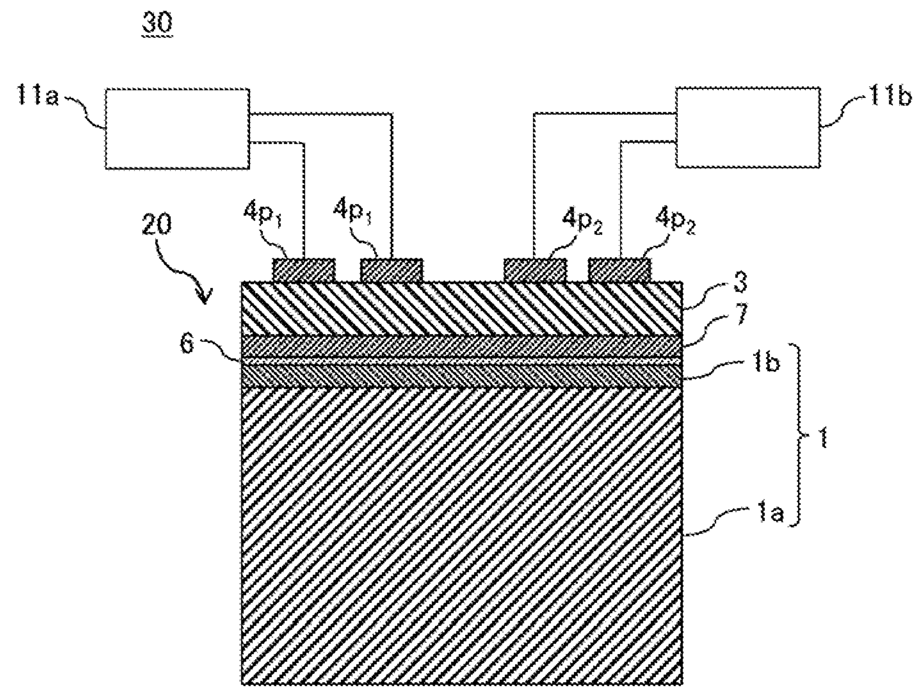
FIG. 3 is a schematic constitution view of a piezoelectric film device according to an embodiment of the present disclosure.

FIG. 3 shows a schematic constitution view of a device 30 having the piezoelectric film of the present embodiment (also referred to as piezoelectric film device 30 hereafter). The piezoelectric film device 30 is constituted including at least an element 20 having the piezoelectric film (also referred to as piezoelectric film element 20 hereafter) obtained by forming the above laminated substrate 10 into a prescribed shape, and a voltage application means 11*a* and a voltage detection means 11*b* which are connected to the piezoelectric film element 20.

The piezoelectric film element 20 has pattern electrodes obtained by forming the top electrode film 4 into a prescribed pattern. The piezoelectric film element 20 has a pair of positive-negative pattern electrodes 4$p_1$ which are input-side electrodes, and a pair of positive-negative pattern electrodes 4$p_2$ which are output-side electrodes. A comb-shaped electrode (IDT: Inter Digital Transducer) is used as the pattern electrodes 4$p_1$ and 4$p_2$, for example.

By connecting the voltage application means 11*a* between the pattern electrodes 4$p_1$ and connecting the voltage detection means 11*b* between the pattern electrodes 4$p_2$, the piezoelectric film device 30 can function as a filter device such as a SAW filter. By applying a voltage between the pattern electrodes 4$p_1$ using the voltage application means 11*a*, SAW can excite on the surface of the KNN-film 3. A frequency of excited SAW can be adjusted by adjusting a pitch between the pattern electrodes 4$p_1$, for example. For example, the frequency of SAW becomes high as a pitch of IDT as the pattern electrodes 4$p_1$ is short, and the frequency of SAW becomes low as the above pitch is long. A voltage is generated between the pattern electrodes 4$p_2$, due to SAW having a prescribed frequency (frequency component) determined according to the pitch of IDT as the pattern electrodes 4$p_2$ in the SAW which is excited by the voltage application means 11*a*, propagates in the KNN-film 3, and reaches the pattern electrodes 4$p_2$. By detecting this voltage using the voltage detection means 11*b*, SAW having a prescribed frequency in the excited SAW can be extracted. The "prescribed frequency" as used here can include not only a prescribed frequency but also a prescribed frequency band in which a center frequency is prescribed frequency.

(3) A Method for Manufacturing a Laminated Substrate, a Piezoelectric Film Element, and a Piezoelectric Film Device Next, a method for manufacturing the above laminated substrate 10 will be described. First, the base film 7 is formed on any one of main surfaces of the substrate 1. It is also acceptable to prepare the substrate 1 on which the base film 7 is formed in advance on any one of its main surfaces. Next, the KNN-film 3 is formed on the base film 7 using the sputtering method for example. Thereafter, the top electrode film 4 is formed on the KNN-film 3 using the sputtering method for example, and therefore the laminated substrate 10 is obtained. Then, the laminated substrate 10 is formed into a prescribed shape, for example, the top electrode film 4 is formed into the pattern electrodes 4$p_1$ and 4$p_2$ by etching, etc., and therefore the piezoelectric film element 20 is obtained. Further, the voltage application means 11*a* is connected between the pattern electrodes 4$p_1$ of the piezoelectric film element 20, and the voltage detection means 11*b* is connected between the pattern electrodes 4$p_2$ of the piezoelectric film element 20, and therefore the piezoelectric film device 30 is obtained.

(4) Effect Obtained by the Present Embodiment

According to the present embodiment, one or more of the following effects can be obtained.

(a) Since the sound speed of the KNN-film 3 is 5100 m/s or more, a resonance frequency of the piezoelectric film device 30 produced by processing the laminated substrate 10 having the KNN-film 3 can be high frequency. Thereby, the piezoelectric film device 30 can be suitably applied to a filter device of a high frequency band compared to a piezoelectric film device obtained by processing a laminated substrate having conventional KNN-film.

Namely, since the sound speed of the KNN-film 3 is fast, the piezoelectric film device 30 can suitably function as a high frequency filter.

When the sound speed of the KNN-film 3 is less than 5100 m/s, it is difficult to use the piezoelectric film device as the high frequency filter, in some cases. Further, even in a case that such a piezoelectric film device can be used as the high frequency filter, a filter property of this high frequency filter becomes low, in some cases.

(b) Since the sound speed of the KNN-film 3 is 5100 m/s or more, the piezoelectric film device 30 can be actuated at a higher frequency without shortening the pitch of the pattern electrodes 4*p*, when the thickness of the KNN-film 3 is constant. Namely, when the piezoelectric film device 30 capable of actuating at high frequency is produced, it is not necessary to make a minute pattern electrodes 4*p*.

(c) Since the (001)-orientation ratio of the KNN-film 3 is 85% or more, the sound speed of the KNN-film 3 can be 5700 m/s or more. Further, the (001)-orientation ratio of the KNN-film 3 is 90% or more, the sound speed of the KNN-film 3 can be 5800 m/s or more. It is already found by the present inventors that the sound speed of the KNN-film 3 is 5650 m/s when the (001)-orientation ratio of the KNN-film 3 is 78%, and the sound speed of the KNN-film 3 is 5820 m/s for example when the (001)-orientation ratio of the KNN-film 3 is 92%.

(d) Since the absolute value $|d_{31}|$ of the piezoelectric constant of the KNN-film 3 is 90 pm/V or more, the high frequency filter can be a low loss filter, or a reduction of a detecting sensitivity of frequency can be prevented, when the piezoelectric film device 30 is used as the high frequency filter. Namely, since the KNN-film 3 has excellent piezoelectric property, a performance of the piezoelectric film device 30 can be enhanced.

Here, for reference, conventional laminated substrate using for the high frequency filter will be described.

Conventionally, for example, a piezoelectric film device using a laminated substrate having a piezoelectric film made of aluminum nitride (AlN) (also referred to as AlN-film hereafter), functions as the high frequency filter. However, there is a problem as follows: although a sound speed of the AlN-film is faster than that of the KNN-film, an absolute value $|d_{31}|$ of a piezoelectric constant of the AlN-film is smaller than that of the KNN-film. For example, although the sound speed of the AlN-film is 10000 m/s or more, the absolute value $|d_{31}|$ of the piezoelectric constant of the AlN-film is about 5 pm/V. Therefore, when this piezoelectric film device functions as the high frequency filter, this filter becomes low performance filter.

Further, for example, it is also conceivable that a piezoelectric film device using a laminated substrate having a piezoelectric film made of lead zirconate titanate (PZT) (also referred to as PZT-film hereafter), functions as the high frequency filter. However, there is a problem as follows: although the PZT-film has the piezoelectric property similar to that of the KNN-film, a sound speed of the PZT-film is slower than that of the KNN-film. For example, although an absolute value $|d_{31}|$ of a piezoelectric constant of the PZT-film is 90 pm/V or more, the sound speed of the PZT-film is about 4000 to 5000 m/s. Therefore, it is necessary to make a minute pitch between the pattern electrodes compared to the pitch of the piezoelectric film device having the above KNN-film, in order to function the piezoelectric film device having the PZT-film as the high frequency filter. There is also a problem as follows: since the pitch of the pattern electrodes in the high frequency filter is micrometer (μm) order, in the piezoelectric film device having the PZT-film, it is very difficult to make a minute pitch between the pattern electrodes with high accuracy.

(5) Modified Example

The present embodiment is not limited to the abovementioned embodiment, and can be modified as the following modified examples.

Figure 4:
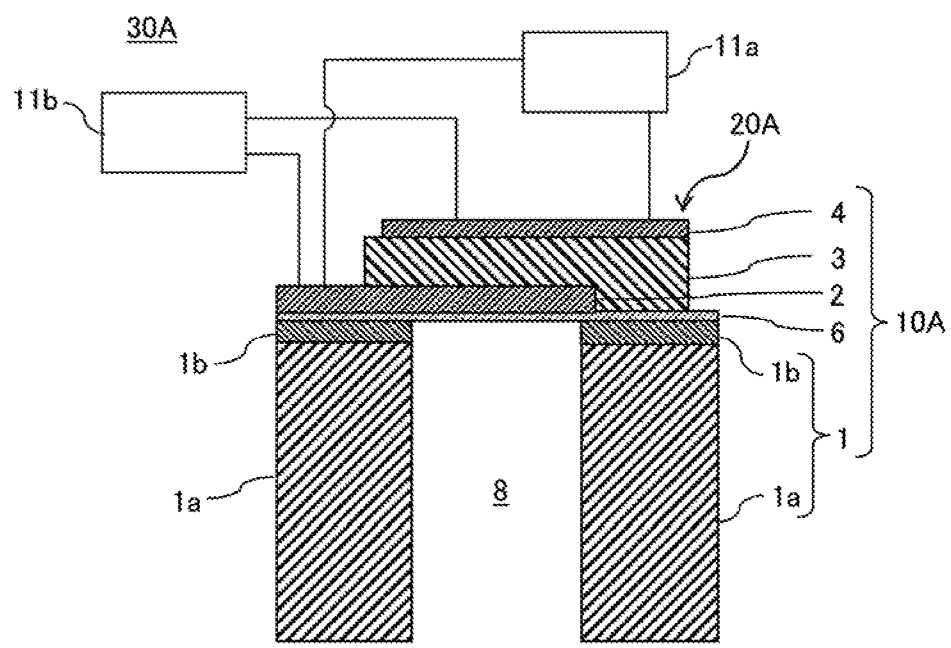
FIG. 4 is a view showing a modified example of the cross-sectional structure of the piezoelectric film device according to an embodiment of the present disclosure.

The above piezoelectric film device 30 may be applied to a filter device utilizing a bulk acoustic wave. For example, the piezoelectric film device 30 may function as a Bulk Acoustic Wave (BAW) filter such as a piezoelectric thin film acoustic resonator (FBAR: Film Bulk Acoustic Resonator). FIG. 4 shows a schematic constitution view of a piezoelectric film device 30A capable of functioning as a FBAR filter. As shown in FIG. 4, the piezoelectric film device 30A is constituted including at least a piezoelectric film element 20A obtained by forming a laminated substrate 10A into a prescribed shape, and the voltage application means 11*a* and the voltage detection means 11*b* which are connected to the piezoelectric film element 20A.

The laminated substrate 10A is constituted as a laminate including the substrate 1, the bottom electrode film 2 provided on the substrate 1, the KNN-film (piezoelectric film) 3 provided on the bottom electrode film 2, and the top electrode film 4 provided on the KNN-film 3. The bottom electrode film 2 can be the same constitution as the above base film 7. The KNN-film 3 has a region where the thickness is thin (also referred to as thin area hereafter). Further, the laminated substrate 10A has a cavity 8 for oscillating freely the KNN-film 3. In this modified example, the cavity 8 is formed by forming a through hole on the substrate 1. The cavity 8 may be formed after forming the KNN-film 3 and before forming the top electrode film 4, or may be formed after forming the top electrode film 4. The cavity 8 is not limited to the constitution exemplified in FIG. 4, and may be publicly-known various constitutions. Further, in the piezoelectric film element 20A, the top electrode film 4 is not required to be IDT, and the top electrode film 4 may be formed into a prescribed shape (pattern).

In the piezoelectric film device 30A, the voltage application means 11*a* and the voltage detection means 11*b* are connected between the bottom electrode film 2 and the top electrode film 4, respectively. In this modified example, the voltage application means 11*a* is connected to the top electrode film 4 located on an area other than the thin area of the KNN-film 3, and the voltage detection means 11*b* is connected to the top electrode film 4 located on the thin area of the KNN-film 3.

By applying a voltage between the bottom electrode film 2 and the top electrode film 4 using the voltage application means 11*a*, BAW is excited in the KNN-film 3. A frequency of BAW, namely, a resonance frequency of the KNN-film 3 can be adjusted by adjusting a thickness of the region other than the thin area of the KNN-film 3, for example. The resonance frequency of the KNN-film 3 (BAW) becomes high as the thickness of the KNN-film 3 becomes thin, and the resonance frequency of the KNN-film 3 becomes low as the thickness of the KNN-film 3 becomes thick. A voltage is generated between the bottom electrode film 2 and the top electrode film 4, due to BAW having a prescribed frequency (frequency component) determined according to the thickness of the thin region of the KNN-film 3, etc., in the BAW which is excited by the voltage application means 11*a*, propagates in the KNN-film 3, and reaches an out-put side electrode. By detecting this voltage using the voltage detection means 11*b*, BAW having a prescribed frequency in the excited BAW can be extracted.

In this modified example as well, the similar effect as the above embodiment can be obtained. Further, in this modified example, namely, in BAW filter, since it is not necessary to form the top electrode film 4 into IDT, a minute processing of the top electrode film 4 is not required. Further, since BAW filter does not have IDT, it is easy to produce a filter with lower loss and higher electric power resistance than SAW filter.

Other Embodiment

As described above, explanation has been given specifically for the embodiments of the present disclosure. However, the present disclosure is not limited thereto, and can be variously modified in a range not departing from the gist of the disclosure.

For example, the piezoelectric film device according to the above embodiment can function as an actuator by connecting the voltage application means between the bottom electrode film (base film) and the top electrode film. By applying a voltage between the bottom electrode film and the top electrode film using the voltage application means, the KNN-film (piezoelectric film) can be deformed. Various members connected to the piezoelectric film device can be actuated due to the above deformation motion. In this case, the piezoelectric film device can be applied to a head for an inkjet printer, a MEMS mirror for a scanner, and a vibrator for an ultrasonic generator, etc., for example.

Further, for example, the piezoelectric film device according to the above embodiment can function as a sensor by connecting the voltage detection means between the bottom electrode film (base film) and the top electrode film. When the KNN-film is deformed according to a variation of some physical quantity, a voltage is generated between the bottom electrode film and the top electrode film due to the deformation. By detecting this voltage using the voltage detection means, the physical quantity applied to the KNN-film can be measured. In this case, the piezoelectric film device can be applied to an angular velocity sensor, an ultrasonic sensor, a pressure sensor, and an acceleration sensor, etc., for example.

Further, in the above embodiment, the substrate may be removed from the laminated substrate when forming the laminated substrate into the piezoelectric film element, as long as the piezoelectric film device produced using the laminated substrate (piezoelectric film element) is applied to desired applications such as a high frequency filter.

Preferable Aspects of the Present Disclosure

Preferable aspects of the present disclosure will be supplementarily described hereafter.

(Supplementary Description 1)

According to an aspect of the present disclosure, there is provided a laminated substrate having a piezoelectric film, including:

a substrate; and a piezoelectric film provided on the substrate interposing a base film, wherein the piezoelectric film has an alkali niobium oxide based perovskite structure represented by a composition formula of $(K_{1-x}Na_x)NbO_3$ ($0<x<1$) and preferentially oriented in (001) plane direction, and a sound speed of the piezoelectric film is 5100 m/s or more.

(Supplementary Description 2)

Preferably, there is provided the substrate of the supplementary description 1, wherein an absolute value $|d_{31}|$ of a piezoelectric constant of the piezoelectric film is 90 pm/V or more.

(Supplementary Description 3)

According to another aspect of the present disclosure, there is provided a laminated substrate having a piezoelectric film, including:

a substrate; and a piezoelectric film on the substrate interposing a base film, wherein a sound speed of the piezoelectric film is 5100 m/s or more, and an absolute value $|d_{31}|$ of a piezoelectric constant of the piezoelectric film is 90 pm/V or more.

(Supplementary Description 4)

Preferably, there is provided the substrate of the supplementary description 3, wherein the piezoelectric film has an alkali niobium oxide based perovskite structure represented by a composition formula of $(K_{1-x}Na_x)NbO_3$ ($0<x<1$) and preferentially oriented in (001) plane direction.

(Supplementary Description 5)

Preferably, there is provided the substrate of any one of the supplementary descriptions 1 to 4, wherein the sound speed of the piezoelectric film is 5700 m/s or more.

(Supplementary Description 6)

Preferably, there is provided the substrate of any one of the supplementary descriptions 1 to 5, wherein the piezoelectric film comprises crystals (alkali niobium oxide) constituting the piezoelectric film, and 85% or more of the crystals are oriented in (001) plane direction.

(Supplementary Description 7)

Preferably, there is provided the substrate of any one of the supplementary descriptions 1 to 6, wherein a thickness of the piezoelectric film is 0.5 μm or more and 5 μm or less.

(Supplementary Description 8)

According to further another aspect of the present disclosure, there is provided an element having a piezoelectric film or a device having a piezoelectric film, including:

a substrate;

a piezoelectric film provided on the substrate interposing a base film; and an electrode film (pattern electrode film) provided on the piezoelectric film, wherein the piezoelectric film has an alkali niobium oxide based perovskite structure represented by a composition formula of $(K_{1-x}Na_x)NbO_3$ ($0<x<1$) and preferentially oriented in (001) plane direction, and a sound speed of the piezoelectric film is 5100 m/s or more.

(Supplementary Description 9)

According to further another aspect of the present disclosure, there is provided an element having a piezoelectric film or a device having a piezoelectric film, including:

a substrate;

a piezoelectric film provided on the substrate interposing a base film; and an electrode film (pattern electrode film) provided on the piezoelectric film, wherein a sound speed of the piezoelectric film is 5100 m/s or more, and an absolute value $|d_{31}|$ of a piezoelectric constant of the piezoelectric film is 90 pm/V or more.

(Supplementary Description 10)

According to further another aspect of the present disclosure, there is provided an element having a piezoelectric film or a device having a piezoelectric film, including:

a substrate;

a bottom electrode film provided on the substrate;

a piezoelectric film provided on the bottom electrode film; and a top electrode film provided on the piezoelectric film, wherein the piezoelectric film has an alkali niobium oxide based perovskite structure represented by a composition formula of $(K_{1-x}Na_x)NbO_3$ ($0<x<1$) and preferentially oriented in (001) plane direction, and a sound speed of the piezoelectric film is 5100 m/s or more.

(Supplementary Description 11)

According to further another aspect of the present disclosure, there is provided an element having a piezoelectric film or a device having a piezoelectric film, including:

a substrate;

a bottom electrode film provided on the substrate;

a piezoelectric film provided on the bottom electrode film; and a top electrode film provided on the piezoelectric film, wherein a sound speed of the piezoelectric film is 5100 m/s or more, and an absolute value $|d_{31}|$ of a piezoelectric constant of the piezoelectric film is 90 pm/V or more.

(Supplementary Description 12)

According to further another aspect of the present disclosure, there is provided a method for manufacturing a laminated substrate having a piezoelectric film, including:

forming a piezoelectric film on a substrate interposing a base film, the piezoelectric film having an alkali niobium oxide based perovskite structure represented by a composition formula of $(K_{1-x}Na_x)NbO_3$ $(0<x<1)$ and preferentially oriented in (001) plane direction, and having a sound speed of 5100 m/s or more.

(Supplementary Description 13)

According to further another aspect of the present disclosure, there is provided a method for manufacturing a laminated substrate having a piezoelectric film, including:

forming a piezoelectric film on a substrate interposing a base film, with its sound speed being 5100 m/s or more and its absolute value $|d_{31}|$ of a piezoelectric constant being 90 pm/V or more.

DESCRIPTION OF SIGNS AND NUMERALS

1 Substrate
3 Piezoelectric film
10 Laminated substrate

The invention claimed is:

1. A laminated substrate having a piezoelectric film, comprising:

a substrate; and a piezoelectric film provided on the substrate interposing a base film, wherein the piezoelectric film has an alkali niobium oxide based perovskite structure represented by a composition formula of $(K_{1-x}Na_x)NbO_3$ $(0<x<1)$, 85% or more crystals of a crystal group constituting the piezoelectric film are oriented in (001) plane direction, and a sound speed of the piezoelectric film is 5100 m/s or more.

2. The laminated substrate having a piezoelectric film according to claim 1, wherein an absolute value $|d_{31}|$ of a piezoelectric constant of the piezoelectric film is 90 pm/V or more.

3. The laminated substrate having a piezoelectric film according to claim 1, wherein the piezoelectric film contains an element of Cu, Mn, Li, Ta, or Sb in a range of 5 at % or less.

* * * * *